US009466852B2

(12) United States Patent  
Komori et al.

(10) Patent No.: US 9,466,852 B2  
(45) Date of Patent: Oct. 11, 2016

(54) PROTON CONDUCTOR AND PROTON CONDUCTOR DEVICE

(71) Applicant: Panasonic Intellectual Property Management Co., Ltd., Osaka (JP)

(72) Inventors: Tomoyuki Komori, Osaka (JP); Yuji Zenitani, Nara (JP); Takashi Nishihara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 170 days.

(21) Appl. No.: 14/582,761

(22) Filed: Dec. 24, 2014

(65) Prior Publication Data

US 2015/0111129 A1 Apr. 23, 2015

Related U.S. Application Data

(63) Continuation of application No. PCT/JP2014/002364, filed on Apr. 28, 2014.

(30) Foreign Application Priority Data

May 7, 2013 (JP) ................................. 2013-097650

(51) Int. Cl.
*H01M 8/10* (2016.01)
*C23C 14/08* (2006.01)
(Continued)

(52) U.S. Cl.
CPC ............ *H01M 8/1004* (2013.01); *C23C 14/08* (2013.01); *C23C 14/185* (2013.01); *C25B 9/08* (2013.01);
(Continued)

(58) Field of Classification Search
CPC ........... H01M 8/1004; H01M 8/1253; H01M 8/1016; H01M 8/1213; H01M 8/12; H01M 4/881; H01M 4/92; H01M 2300/0074; H01M 2300/0071; H01M 2008/1293; H01B 1/122; C23C 14/185; C23C 14/08; C25B 9/08; C25B 13/04; C30B 23/02; C30B 29/02; C30B 29/22; Y02E 60/521; Y02E 60/525

See application file for complete search history.

(56) References Cited

U.S. PATENT DOCUMENTS

2006/0166068 A1 7/2006 Taniguchi  
2009/0110996 A1* 4/2009 Shim ...................... C23C 26/00  
                                                          429/411

(Continued)

FOREIGN PATENT DOCUMENTS

JP       08-195206 A     7/1996  
JP     2005-100978 A     4/2005

(Continued)

OTHER PUBLICATIONS

Vaquero Aguilar Journal of the European Ceramic Society pp. 1333-1338.*

(Continued)

*Primary Examiner* — Patrick Ryan  
*Assistant Examiner* — Aaron Greso  
(74) *Attorney, Agent, or Firm* — McDermott Will & Emery LLP

(57) ABSTRACT

A proton conductor includes an electrolytic layer having first and second main surfaces; and a plurality of catalyst particles. The first main surface of the electrolytic layer includes a flat portion and a plurality of recessed portions. The plurality of catalyst particles are respectively located in the plurality of recessed portions. The flat portion of the first main surface and parts of surfaces of the plurality of catalyst particles exposed from the plurality of recessed portions form a third main surface. The electrolytic layer is formed of a single crystal of a perovskite-type oxide having a proton conductivity. The catalyst particles are formed of a single crystal of a noble metal material. The perovskite-type oxide of the electrolytic layer) has a crystal orientation that matches a crystal orientation of the noble metal material of the plurality of catalyst particles.

14 Claims, 6 Drawing Sheets

(51) Int. Cl.
*C30B 29/22* (2006.01)
*H01M 8/12* (2016.01)
*H01M 4/86* (2006.01)
*H01M 4/92* (2006.01)
*H01M 4/88* (2006.01)
*H01B 1/12* (2006.01)
*C30B 29/02* (2006.01)
*C25B 9/08* (2006.01)
*C25B 13/04* (2006.01)
*C30B 23/02* (2006.01)
*C23C 14/18* (2006.01)

(52) U.S. Cl.
CPC ............... *C25B 13/04* (2013.01); *C30B 23/02* (2013.01); *C30B 29/02* (2013.01); *C30B 29/22* (2013.01); *H01B 1/122* (2013.01); *H01M 4/86* (2013.01); *H01M 4/881* (2013.01); *H01M 4/92* (2013.01); *H01M 8/1016* (2013.01); *H01M 8/12* (2013.01); *H01M 8/1213* (2013.01); *H01M 8/1253* (2013.01); *H01M 2008/1293* (2013.01); *H01M 2300/0071* (2013.01); *H01M 2300/0074* (2013.01); *Y02E 60/521* (2013.01); *Y02E 60/525* (2013.01)

(56) References Cited

U.S. PATENT DOCUMENTS

2009/0239119 A1   9/2009   Maruyama

2010/0001619 A1*  1/2010   Yuuya .................. B06B 1/0629
                                                    310/334

FOREIGN PATENT DOCUMENTS

| JP | 2006-252826 A | 9/2006 |
| JP | 2008-021466 A | 1/2008 |
| JP | 2008-098145 A | 4/2008 |
| JP | 2008-153192 A | 7/2008 |
| JP | 2009-054515 A | 3/2009 |
| JP | 2011-150932 A | 8/2011 |
| JP | 4888791 B2 | 2/2012 |
| JP | 2012-084460 A | 4/2012 |
| JP | 2014-067493 A | 4/2014 |
| WO | 00/42621 A2 | 7/2000 |
| WO | 2009/096399 A1 | 8/2009 |
| WO | 2014/034794 A1 | 3/2014 |

OTHER PUBLICATIONS

Jean Van Muylder Electrochemical Materials Science V4 ed Bockris et al Plenum Press New York 1981.*
Singh et al Journal of Applied Physics, vol. 103 Issue 6 Article No. 063524 2008.*
International Search Report issued in International Application No. PCT/JP2014/002364 dated Jun. 24, 2014, with English translation.

* cited by examiner

PROTON CONDUCTOR AND PROTON CONDUCTOR DEVICE

This is a continuation of International Application No. PCT/JP2014/002364, with an international filing date of Apr. 28, 2014, which claims priority of Japanese Patent Application No. 2013-097650, filed on May 7, 2013, the contents of which are hereby incorporated by reference.

BACKGROUND

1. Technical Field

The present application relates to a proton conductor and a proton conductor device.

2. Description of the Related Art

A proton conductor used for a fuel cell or the like is known. FIG. 8 shows a proton conductor described in Japanese Patent No. 4887791. The proton conductor shown in FIG. 8 includes a non-porous hydrogen-transmissive metal 300, a proton conversion layer 302, and a glass electrolytic layer 301. Japanese Patent No. 4887791 discloses that a catalyst layer of an island-like structure is used as the proton conversion layer 302 and the glass electrolytic layer 301 is made thin, so that a proton conductor having a high mechanical strength and a small film resistance is realized.

SUMMARY

Conventionally, proton conductor are desired to have a higher proton conductivity. A non-limiting illustrative embodiment in this application provides a proton conductor and a proton conductor device having a higher proton conductivity.

A proton conductor in an embodiment according to the present application includes an electrolytic layer having first and second main surfaces; and a plurality of catalyst particles that are provided from the first main surface to the inside of the electrolytic layer and are exposed at the first main surface. The electrolytic layer is formed of a single crystal of a perovskite-type oxide having a proton conductivity; the plurality of catalyst particles are formed of a single crystal of a noble metal material; and the perovskite-type oxide of the electrolytic layer has a crystal orientation that matches a crystal orientation of the noble metal material of the plurality of catalyst particles.

In a proton conductor according to an embodiment in this application, the electrolytic layer is formed of a single-crystalline perovskite-type oxide, and the catalyst particles are provided from the main surface to the inside of the electrolytic layer. Therefore, the proton conductor has a high proton conductivity.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1A:
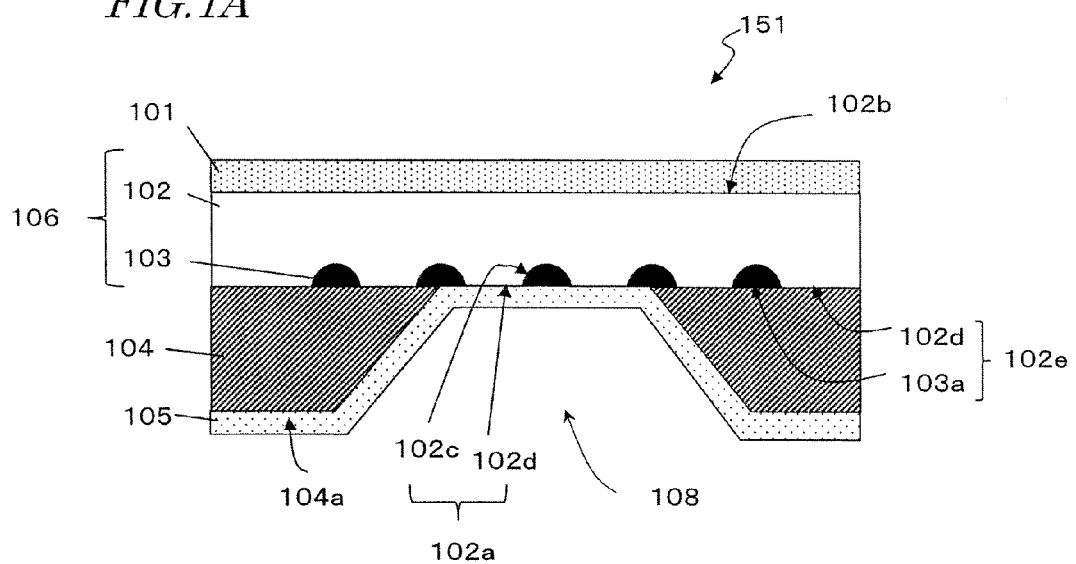
FIG. 1A is a cross-sectional view showing a proton conductor and a proton conductor device in Embodiment 1 according to the present application.

An overview of an embodiment according to the present application is as follows.

A proton conductor in an embodiment according to the present application includes an electrolytic layer having first and second main surfaces; and a plurality of catalyst particles. The first main surface of the electrolytic layer includes a flat portion and a plurality of recessed portions; the plurality of catalyst particles are respectively located in the plurality of recessed portions; the flat portion of the first main surface and parts of surfaces of the plurality of catalyst particles exposed from the plurality of recessed portions form a third main surface; the electrolytic layer is formed of a single crystal of a perovskite-type oxide having a proton conductivity; the plurality of catalyst particles are formed of a single crystal of a noble metal material; and the perovskite-type oxide of the electrolytic layer has a crystal orientation that matches a crystal orientation of the noble metal material of the plurality of catalyst particles.

The third main surface may have an arithmetic average roughness (Ra) of greater than or equal to 1 nm and less than or equal to 50 nm.

The noble metal material may be single-crystalline.

The noble metal material may be platinum.

The crystal orientation may be (001).

The perovskite-type oxide may be of a tetragonal crystal system.

The perovskite-type oxide may be formed of a material having a composition represented by $A_xL_{1-y}M_yO_{3-\alpha}$; the A may contain Ba, and x may be greater than or equal to 0.6 and less than 1; and the M may contain Y, and y may be greater than 0 and less than or equal to 0.40.

A stress of the electrolytic layer may be a compressive stress, and may be greater than or equal to 250 MPa and less than or equal to 1.0 GPa.

A proton conductor device in an embodiment according to the present application includes the proton conductor described in any one of the above; a support that is provided on the third main surface of the proton conductor and has an opening; a first gas-transmissive electrode provided in at least the opening of the support so as to be in contact with the third main surface in the opening; and a second gas-transmissive electrode provided on the second main surface. A part of the surface of at least one of the plurality of catalyst particles is located in the opening of the support and is in contact with the first gas-transmissive electrode.

A proton conductor device in another embodiment according to the present application includes the proton conductor described in any one of the above; a first gas-transmissive electrode provided on the third main surface of the proton conductor; a support that is provided on the second main surface, has an opening, and exposes the second main surface in the opening; and a second gas-transmissive electrode provided in the opening of the support so as to be in contact with the second main surface of the electrolytic layer in at least the opening.

The support may be formed of magnesium oxide, strontium titanate or silicon.

A fuel cell in an embodiment according to the present application includes a proton conductor of any one of the above; a positive electrode in contact with the third main surface of the proton conductor; and an negative electrode in contact with the second main surface of the proton conductor.

A hydrogen storage device in an embodiment according to the present application includes a proton conductor of any one of the above; a positive electrode in contact with the third main surface of the proton conductor; and an negative electrode in contact with the second main surface of the proton conductor.

A method for producing a proton conductor in an embodiment according to the present application includes the steps of forming a plurality of catalyst particles formed of a single crystal of a noble metal material on a support; and forming an electrolytic layer on the support such that the electrolytic layer covers the plurality of catalyst particles, the electrolytic layer being formed of a single crystal of a perovskite-type oxide that has a crystal orientation matching that of the noble metal material and having a proton conductivity.

Hereinafter, a proton conductor and a proton conductor device according to the present application will be described with reference to the drawings.

Embodiment 1

A proton conductor and a proton conductor device in Embodiment 1 according to the present application will be described.

FIG. 1A is a schematic cross-sectional view of a proton conductor device 151 including a proton conductor 106 in this embodiment. The proton conductor 106 includes an electrolytic layer 102 and a plurality of catalyst particles 103.

The electrolytic layer 102 has a first main surface 102a and a second main surface 102b. The electrolytic layer 102 has an insulating property and a proton conductivity. Specifically, the electrolytic layer 102 is formed of an oxide having a perovskite-type crystalline structure expressed by general formula $A_xL_{1-y}M_yO_{3-\alpha}$ ($\alpha$ is an oxygen deficiency level; $0<\alpha<1.5$). The A site represents at least one element of alkaline earth metals such as barium (Ba), strontium (Sr), calcium (Ca) and the like. In the general formula, a B site is represented by L and M, and L represents at least one element among zirconium (Zr), titanium (Ti), cerium (Ce) and hafnium (Hf). M represents at least one among group III elements including yttrium (Y) and the like and group XIII elements including indium (In) and the like. Composition ratio y of the element of the B site is in the range that exceeds 0 and less than or equal to 0.4. Preferably, y exceeds 0.2 and less than or equal to 0.35.

A perovskite-type oxide generally has a proton conductivity. A perovskite-type oxide exhibits a high proton conductivity at a temperature of, for example, 200° C. Therefore, the electrolytic layer 102 formed of an oxide having a perovskite-type crystalline structure may have proton conducted from the first main surface 102a to the second main surface 102b or in the opposite direction. In the case where the perovskite-type oxide that forms the electrolytic layer 102 is single-crystalline, there are less grain boundaries that act as a resistance against proton transfer. As a result, the conductivity of proton is increased. Especially in the case where the perovskite-type oxide is of a single crystal of a tetragonal crystal system, the electrolytic layer 102 has a higher proton conductivity. In the case where the A site contains the element of Ba and the composition ratio x is greater than or equal to 0.6 and less than 1, the electrolytic layer 102 of a single crystal is easily provided on the catalyst particles 103. Preferably, the composition ratio x is greater than or equal to 0.75 and less than 0.9.

The electrolytic layer 102 has a thickness that can be appropriately selected in accordance with the use of the proton conductor 106. As described later, in the case where the proton conductor device 151 in this embodiment is used for a fuel cell, the thickness of the electrolytic layer 102 may be, for example, about 1 μm to about 10 μm.

As shown in FIG. 1A, the first main surface 102a of the electrolytic layer 102 has a plurality of recessed portions 102c and a flat portion 102d, and the plurality of catalyst particles 103 are respectively located in the plurality of recessed portions 102c. Because of this structure, the flat portion 102d of the first main surface 102a and parts 103a of surfaces of the plurality of catalyst particles 103 exposed from the plurality of recessed portions 102c form a third main surface 102e. Namely, the catalyst particles 103 are buried in the electrolytic layer 102.

In the state where the catalyst particles 103 are buried in the electrolytic layer 102, the third main surface 102e may be expressed as being formed of the surface of the electrolytic layer 102 and the surfaces of the catalyst particles 103. For example, the catalyst particles 103 each have a shape protruding from the first main surface 102a toward the inside of the electrolytic layer 102. The catalyst particles 103 having such a protruding shape are also expressed as being located in an island-like arrangement.

As described later, the proton conductor 106 is supported by a support 104. In order to increase the adhesiveness between the support 104 and the proton conductor 106, it is preferable that the third main surface 102e having the catalyst particles 103 provided therein is flat. Specifically, it is preferable that the third main surface 102e has an arithmetic average roughness (Ra) of greater than or equal to 1 nm and less than or equal to 50 nm. The arithmetic average roughness (Ra) represents the roughness or flatness of the surface that is formed of the flat portion 102d of the first main surface 102a of the electrolytic layer 102 and the parts 103a of the surfaces of the catalyst particles 103 exposed from the plurality of recessed portions 102c.

As described later, the electrolytic layer 102 may have a compressive stress in order to suppress the proton conductor 106 from being stripped from the support 104. Specifically, the electrolytic layer 102 may have a compressive stress of greater than or equal to 250 MPa and less than or equal to 1.0 GPa.

The catalyst particles 103 may each be separately located at the first main surface 102a to be a part of the third main surface 102e as shown in FIG. 1A. Alternatively, the catalyst particles 103 may be partially in contact with one another. It is not preferable that the first main surface 102a is completely covered with the catalyst particles 103 and thus the third main surface 102e is formed only of the parts of the surfaces of the catalyst particles 103 because in this structure, gas or the like used for a reaction using proton cannot contact the electrolytic layer. In other words, as long as the third main surface 103e includes the flat portion 102d of the first main surface 102a, the catalyst particles 103 may partially have a film shape.

In the case where the proton conductor 106 is used for a fuel cell, at borders between the catalyst particles 103 and the electrolytic layer 102 at the third main surface 103e, electrons are supplied so that oxygen supplied from outside is reduced and contacts proton conducted through the electrolytic layer 102 from the second main surface 102b. As a result, water is generated. Therefore, it is more advantageous for power generation by the fuel cell that the plurality of catalyst particles 103 are each separately located at the third main surface 102e because in this structure, the total length of the borders between the catalyst particles 103 and the electrolytic layer 102 at the third main surface 102e is longer. As the diameter of the catalyst particles is smaller, the total length of the borders is longer, which is more advantageous for power generation by the fuel cell.

The catalyst particles 103 are formed of a catalyst material that promotes a reaction that uses proton conducted through the electrolytic layer 102. For example, a material acting as a catalyst that promotes, for example, a reaction of reducing oxygen and reacting the reduced oxygen with proton to generate water, a reaction of reducing proton to generate hydrogen, or a reaction of incorporating hydrogen into an organic compound is selected. In this embodiment, the catalyst particles 103 are formed of a noble metal material in order to reduce proton. More specifically, the catalyst particles 103 are formed of platinum, palladium or a palladium alloy.

As described later regarding a production method, in this embodiment, the crystallinity of the catalyst particles 103 is utilized to form a single-crystalline perovskite-type oxide. In order to realize this, a noble metal material having a crystallinity is used to form the catalyst particles 103. Specifically, the noble metal material is single-crystalline. In the case where the single-crystalline catalyst particles 103 are used, the perovskite-type oxide of the electrolytic layer 102 has a higher crystallinity. Especially in the case where the noble metal material is of a single crystal aligned in the (001) orientation, the crystallinity of the noble metal material is reflected so that the single-crystalline perovskite-type oxide that is formed is aligned in the (001) orientation. In this case, the perovskite-type oxide of the electrolytic layer 102 has a crystal orientation that matches a crystal orientation of the noble metal material of the catalyst particles 103, and the plane orientation thereof is (001). The lattice constants of platinum and palladium are respectively 3.92 angstroms and 3.89 angstroms, which are not much different from each other. Therefore, even in the case where palladium or a palladium alloy is used, an electrolytic layer formed of a single-crystalline perovskite-type oxide can be formed, like in the case where platinum is used.

The proton conductor device 151 in this embodiment includes the support 104, a first gas-transmissive electrode 105 and a second gas-transmissive electrode 101 in addition to the proton conductor 106.

Figure 1B:
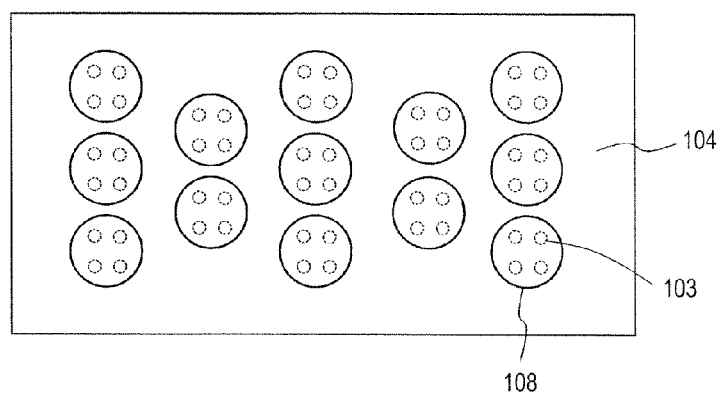
FIG. 1B is a plan view of a support.

The support 104 is provided in contact with the third main surface 102e and supports the proton conductor 106. The support 104 has a plurality of openings 108. FIG. 1B shows the support 104 as seen in a direction vertical to the first main surface 102a. As shown in FIG. 1B, as seen in a direction vertical to the third main surface 102e, the catalyst particles 103 exposed at the third main surface 102e are located in the plurality of openings 108 of the support 104. In FIG. 1B, all the catalyst particles 103 are located in the openings 108. Alternatively, the catalyst particles 103 may be located at positions that are not in the openings 108 and are covered with the support 104.

The support 104 is formed of, for example, magnesium oxide, strontium titanate or silicon.

The linear expansion coefficients of magnesium oxide, strontium titanate and silicon are respectively $13 \times 10^{-6}$ $K^{-1}$, $9.4 \times 10^{-6}$ $K^{-1}$ and $4 \times 10^{-6}$ $K^{-1}$. By contrast, the linear expansion coefficient of the perovskite-type oxide that forms the electrolytic layer 102 (linear expansion coefficient represents the rate of change in the length with respect to the temperature rise) is $8 \times 10^{-6}$ $K^{-1}$ to $11 \times 10^{-6}$ $K^{-1}$. The linear expansion coefficient of platinum is $8.8 \times 10^{-6}$ $K^{-1}$. Therefore, in the case where the proton conductor 106 is formed on the support 104, formed of magnesium oxide or strontium oxide, under general conditions, the support 104 is more expanded than the electrolytic layer 102 when being heated, and thus a compressive stress keeps acting on the proton conductor 106. This suppresses the proton conductor 106 from being stripped from the support 104. By contrast, in the case where the support 104 is formed of silicon, it is preferable to form the electrolytic layer 102 by a sputtering vapor deposition technique so that a compressive stress is applied at the time of layer formation. The stress of the electrolytic layer 102 can be adjusted in accordance with the method or conditions by which the electrolytic layer 102 is formed.

The first gas-transmissive electrode 105 is provided on the support 104 so as to be in contact with the third main surface 102e of the electrolytic layer 102 at least in the openings 108. More specifically, the first gas-transmissive electrode 105 covers a main surface 104a of the support 104 that is not in contact with the electrolytic layer 102, side surfaces of the openings 108, the catalyst particles 103 exposed at bottom surfaces of the openings 108, and parts of the third main surface 102e of the electrolytic layer 102 that are around the openings 108. Because of this structure, the first gas-transmissive electrode 105 is electrically connected to the electrolytic layer 102 and the catalyst particles 103.

The first gas-transmissive electrode 105 is formed of a porous electron conductor so as to allow transmission of hydrogen or an organic material. In the case where the proton conductor device 151 is used for a fuel cell, the first gas-transmissive electrode 105 acts as a positive electrode (cathode), and therefore is formed so as to allow transmission of oxygen. In the case where the proton conductor device 151 is used for a hydrogen storage device, the first gas-transmissive electrode 105 is formed so as to allow transmission of, for example, toluene. Because of such a structure, the borders between the catalyst particles 103 and the electrolytic layer 102 at the third main surface 102d are each a three-phase interface at which proton supplied from the electrolytic layer 102, electrons supplied from the first gas-transmissive electrode 105 and gas such as oxygen or the like that is supplied after being transmitted through the first gas-transmissive electrode 105 contact one another. The first gas-transmissive electrode 105 may be formed of, for example, silver, nickel or the like.

The second gas-transmissive electrode 101 is provided on the second main surface 102b of the electrolytic layer 102. The second gas-transmissive electrode 101 is formed of a porous electron conductor so as to allow transmission of hydrogen. In the case where the proton conductor device 151 is used for a fuel cell, the second gas-transmissive electrode 101 acts as a negative electrode (anode), and therefore is formed of, for example, silver, nickel or the like.

In the proton conductive device 151, the electrolytic layer 102 of the proton conductor 106 prevents shortcircuiting between the second gas-transmissive electrode 101 and the first gas-transmissive electrode 105 and supplies proton generated at the interface between the second gas-transmissive electrode 101 and the electrolytic layer 102 to the catalyst particles 103.

In the case where the proton conductor device 151 is used for a fuel cell, fuel introduced into the second gas-transmissive electrode 101 (e.g., hydrogen) is oxidized to generate proton at the interface between the second gas-transmissive electrode 101 and the electrolytic layer 102 as expressed by formula (1) below. Electrons generated by this reaction are collected by the second gas-transmissive electrode 101.

$$H_2 \rightarrow 2H+ + 2e^- \quad (1)$$

The generated proton is transferred through the electrolytic layer 102 and reduces oxygen, supplied from outside through the first gas-transmissive electrode 105, at the surfaces of the catalyst particles 103 by use of electrons supplied from the first gas-transmissive electrode 105. The reduced oxygen and proton are bonded together to generate water as expressed in formula (2) below. As a result, a voltage is generated between the second gas-transmissive electrode 101 and the first gas-transmissive electrode 105.

$$4H^+ + O_2 + 4e^- \rightarrow 2H_2O \quad (2)$$

In the case where the proton conductor device 151 is used for a hydrogen storage device, when a voltage is applied between the second gas-transmissive electrode 101 and the first gas-transmissive electrode 105, fuel introduced into the second gas-transmissive electrode 101 (e.g., hydrogen) is oxidized to generate proton at the interface between the second gas-transmissive electrode 101 and the first gas-transmissive electrode 105. The generated proton is transferred through the electrolytic layer 102 and is reduced at the surfaces of the catalyst particles 103. As a result, hydrogen is generated. When an organic material (e.g., toluene) is supplied to the first gas-transmissive electrode 105, the organic material is hydrogenated (e.g., into methylcyclohexane). In this case, electricity can be stored as hydrogen.

As described above, the proton conductor device in this embodiment includes the electrolytic layer formed of a single-crystalline perovskite-type oxide, and thus has a high proton conductivity. In addition, the catalyst particles are provided at one main surface of the electrolytic layer. Therefore, proton conducted through the electrolytic layer can be reduced to generate hydrogen by a catalyst action of the catalyst particles, or gas supplied from outside can be reduced.

Figure 2A:
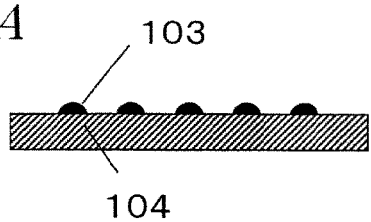
FIGS. 2A through 2E are cross-sectional views showing steps of a method for producing a proton conductor device in Embodiment 1.

Hereinafter, a method for producing a proton conductor and a proton conductor device in this embodiment will be described with reference to FIGS. 2A through 2E First, as shown in FIG. 2A, an MgO substrate is prepared as the support 104. The catalyst particles 103 formed of platinum particles located in an island-like arrangement are formed on a surface of the support 104 by a sputtering vapor deposition technique, a vacuum vapor deposition technique, a pulse laser deposition (hereinafter, referred to as "PLD") technique, or a sol-gel technique. The resultant catalyst particles 103 are single-crystalline platinum particles having a plane orientation of (001).

Figure 2B:
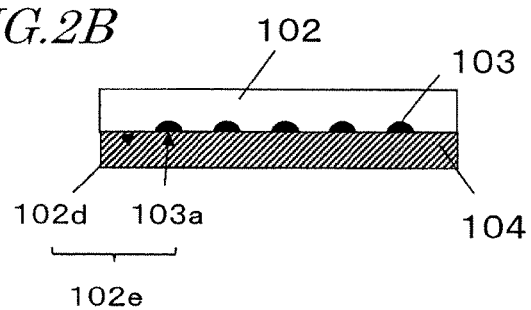

Next, as shown in FIG. 2B, the electrolytic layer 102 formed of a perovskite-type oxide is formed on the catalyst particles 103 by a sputtering vapor deposition technique, a vacuum vapor deposition technique or a PLD deposition technique. After the electrolytic layer 102 is formed, annealing may be performed in order to improve the crystallinity. The resultant electrolytic layer 102 is formed of a perovskite-type oxide that is of a single crystal aligned in conformity with the platinum of the catalyst particles 103 and has a (001) plane. As a result, the third main surface 102e including the flat portion 102d of the first main surface 102a and the parts 103a of the surfaces of the plurality of catalyst particles 103 exposed from the plurality of recessed portions 102c is formed.

Figure 2C:
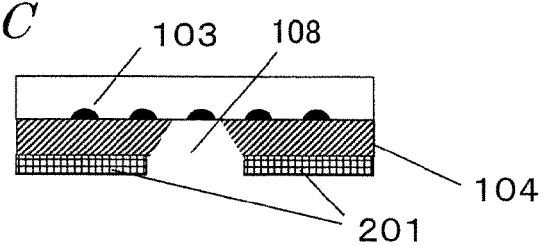

As shown in FIG. 2C, a mask 201 having the openings 108 is formed on the support 104. The support 104 is etched by use of the mask 201 to expose the third main surface 102e, namely, the electrolytic layer 102 and the catalyst particles 103, in the openings 108. The mask 201 is formed by photolithography. Specifically, the mask 201 is formed as follows. A resist is applied to the support 104 and is cured by heating. Areas that should not be exposed to light are shielded against light by use of a mask for exposure. Then, the resultant body is exposed to light for a certain time duration and is subjected to development. In this manner, a resist film can be formed in areas where the resist film needs to be present. The support 104 is etched by wet etching by use of, for example, a heated phosphoric acid solution.

Figure 2D:
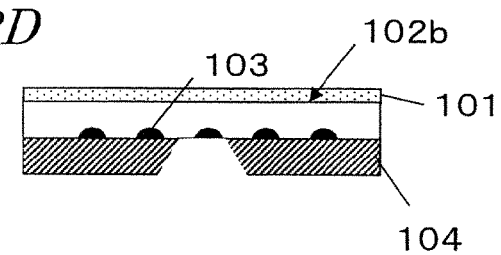

As shown in FIG. 2D, the mask 201 is removed by, for example, being immersed in a stripping solution for a certain time duration. Then, the second gas-transmissive electrode 101 is formed on the second main surface 102b of the electrolytic layer 102. The second gas-transmissive electrode 101 may be formed by any of various methods for forming a porous metal film, with no specific limitation. The second gas-transmissive electrode 101 is formed as follows, for example. To the second main surface 102b of the electrolytic layer 102, a paste containing metal powder particles, specifically, nickel powder particles or silver powder particles, dispersed therein is applied. The resultant body is heated in an inert gas atmosphere, a reduction gas atmosphere or a vacuum atmosphere to remove components other than the metal powder particles from the paste. The heating is performed up to 650 to 850° C. in the case where nickel powder particles are used, or up to 450 to 750° C. in the case where silver powder particles are used. As a result, the metal powder particles are sintered, and thus the second gas-transmissive electrode 101 of a porous metal film is formed.

Figure 2E:
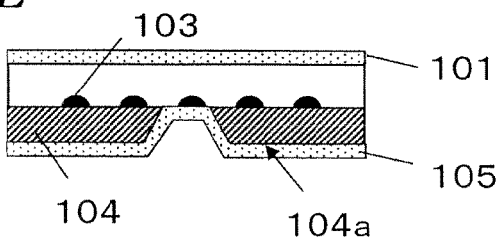

As shown in FIG. 2E, the first gas-transmissive electrode 105 is formed in a continuous pattern on the main surface 104a of the support 104, the side surfaces of the openings 108, and the first main surface 102a of the electrolytic layer 102 that is exposed at the bottom surfaces of the openings 108. The first gas-transmissive electrode 105 may be formed by any of various methods for forming a porous metal film, with no specific limitation. The first gas-transmissive electrode 105 is formed as follows, for example. To the main surface 104a of the support 104, the side surfaces of the openings 108, and the first main surface 102a of the electrolytic layer 102 that is exposed at the bottom surfaces of the openings 108, a paste containing metal powder particles, specifically, nickel powder particles or silver powder particles, dispersed therein is applied. The resultant body is heated in an inert gas atmosphere, a reduction gas atmosphere or a vacuum atmosphere to remove components other than the metal powder particles from the paste. The heating is performed up to 650 to 850° C. in the case where nickel powder particles are used, or up to 450 to 750° C. in the case where silver powder particles are used. As a result, the metal powder particles are sintered, and thus the first gas-transmissive electrode 105 of a porous metal film is formed. Alternatively, the first gas-transmissive electrode 105 may be formed by plating. In this manner, the proton conductor device is produced.

Embodiment 2

A proton conductor and a proton conductor device in Embodiment 2 according to the present application will be described.

Figure 3A:
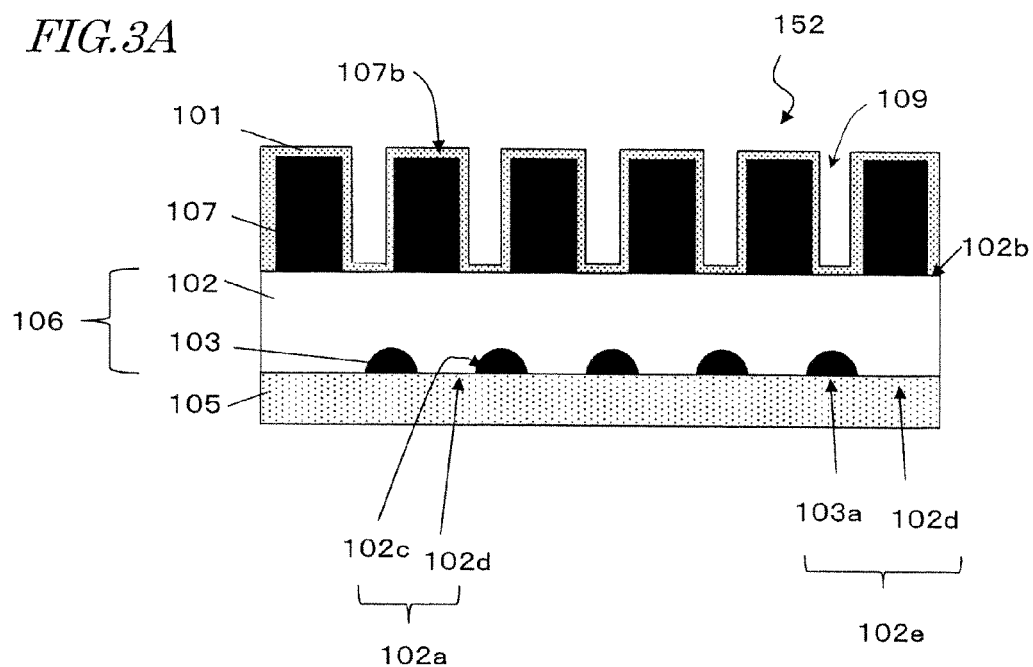
FIG. 3A is a cross-sectional view showing a proton conductor and a proton conductor device in Embodiment 2 according to the present application.

FIG. 3A is a schematic cross-sectional view of a proton conductor device 152 including a proton conductor 106 in this embodiment. The proton conductor 106 has the same structure as that of the proton conductor 106 in Embodiment 1.

The proton conductor device 152 includes the proton conductor 106, a support 107, the first gas-transmissive electrode 105 and the second gas-transmissive electrode 101.

The first gas-transmissive electrode 105 is provided on the third main surface 102e that is formed of the flat portion 102d of the first main surface 102a and the parts 103a of the surfaces of the plurality of catalyst particles 103 exposed from the plurality of recessed portions 102c. Therefore, the first gas-transmissive electrode 105 is electrically connected to the catalyst particles 103.

Figure 3B:
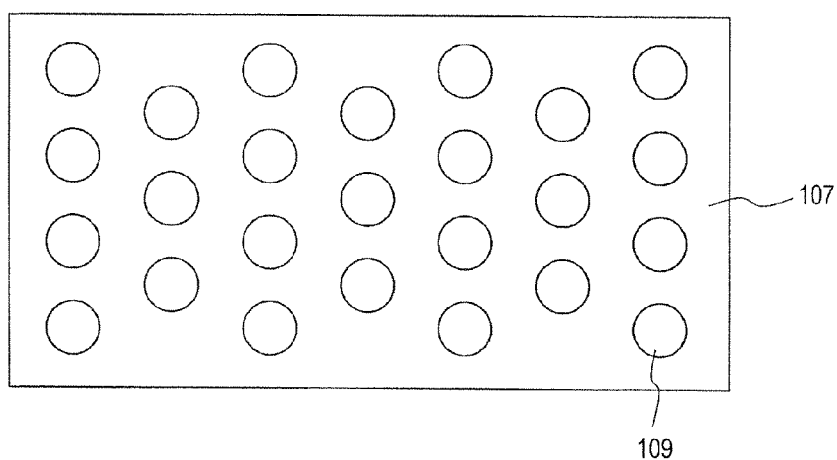
FIG. 3B is a plan view of a support.

FIG. 3B is a plan view of the support 107. The support 107 is provided on the second main surface 102b of the electrolytic layer 102 and has a plurality of openings 109. The openings 109 are through-holes and expose the second main surface 102b.

The second gas-transmissive electrode 101 is provided in the openings 109 of the support 107 so as to be in contact with the second main surface 102b of the electrolytic layer 102 at least in the openings 109. In this embodiment, the second gas-transmissive electrode 101 is provided so as to cover a main surface 107b of the support 107, side surfaces of the openings 109, and the second main surface 102b of the electrolytic layer 102 that is exposed at bottom surfaces of the plurality of openings 109.

In the proton conductor device 152 in this embodiment, the support 107 is in contact with the second main surface 102b of the electrolytic layer 102 and thus supports the proton conductor 106. In this structure also, like in Embodiment 1, the electrolytic layer 102 of the proton conductor 106 can prevent shortcircuiting between the second gas-transmissive electrode 101 and the first gas-transmissive electrode 105 and supply proton generated at the interface between the second gas-transmissive electrode 101 and the electrolytic layer 102 to the catalyst particles 103.

Hereinafter, a method for producing a proton conductor and a proton conductor device in this embodiment will be described with reference to FIGS. 4A through 4H.

Figure 4A:
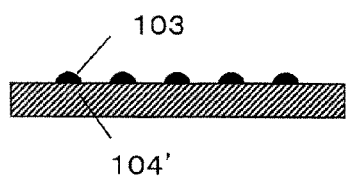
FIGS. 4A through 4H are cross-sectional views showing steps of a method for producing a proton conductor device in Embodiment 2.

First, as shown in FIG. 4A, an MgO substrate is prepared as a support 104'. Like in Embodiment 1, the catalyst particles 103 formed of noble metal particles are formed on a surface of the support 104' by a sputtering vapor deposition technique, a vacuum vapor deposition technique, a pulse laser deposition (hereinafter, referred to as "PLD") technique, or a sol-gel technique.

Figure 4B:
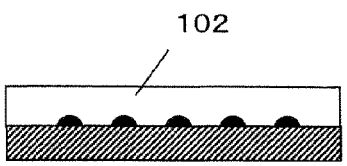

Next, as shown in FIG. 4B, the electrolytic layer 102 is formed on the catalyst particles 103 by a sputtering vapor deposition technique, a vacuum vapor deposition technique or a PLD deposition technique. After the electrolytic layer 102 is formed, annealing may be performed in order to improve the crystallinity. As a result, the third main surface 102e including the flat portion 102d of the first main surface 102a and the parts 103a of the surfaces of the plurality of catalyst particles 103 exposed from the plurality of recessed portions 102c is formed.

Figure 4C:
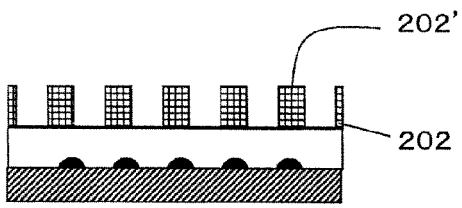

As shown in FIG. 4C, a mask 202 is formed on the electrolytic layer 102. The mask 202 is formed by photolithography. The mask 202 is formed as follows, for example. A resist is applied to the electrolytic layer 102 and is cured by heating. Areas that should not be exposed to light are shielded against light by use of a mask for exposure. Then, the resultant body is exposed to light for a certain time duration and is subjected to development. In this manner, the mask 202 having resist patterns 202' is formed. The resist patterns 202' are located at positions where openings are formed when the support is formed.

Figure 4D:

Next, as shown in FIG. 4D, the support 107 is formed. The support 107 may be formed by a sputtering vapor deposition technique, a vacuum vapor deposition technique, a pulse laser deposition (hereinafter, referred to as "PLD") technique, or a sol-gel technique. Alternatively, the support 107 may be formed by electrolytic plating after a metal seed layer is provided on the electrolytic layer 102.

Figure 4E:
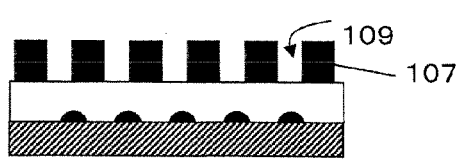

Then, as shown in FIG. 4E, the mask 202 is removed to form the support 107 having the openings 109.

Figure 4F:
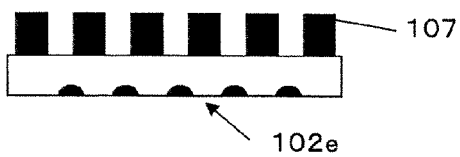

As shown in FIG. 4F, the support 104' is removed. The support 104' is removed by, for example, wet etching by use of a heated phosphoric acid solution. As a result, the third main surface 102e is exposed.

Figure 4G:
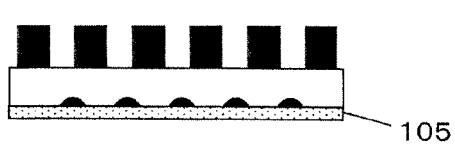

As shown in FIG. 4G, the first gas-transmissive electrode 105 is formed. Like in Embodiment 1, the first gas-transmissive electrode 105 may be formed by any method for forming a porous metal film, with no specific limitation. The first gas-transmissive electrode 105 is formed as follows, for example. To the third main surface 102e of the electrolytic layer 102, a paste containing metal powder particles, specifically, nickel powder particles or silver powder particles, dispersed therein is applied. The resultant body is heated in an inert gas atmosphere, a reduction gas atmosphere or a vacuum atmosphere to remove components other than the metal powder particles from the paste. The heating is performed up to 650 to 850° C. in the case where nickel powder particles are used, or up to 450 to 750° C. in the case where silver powder particles are used. As a result, the metal powder particles are sintered, and thus the first gas-transmissive electrode 105 of a porous metal film is formed.

Figure 4H:
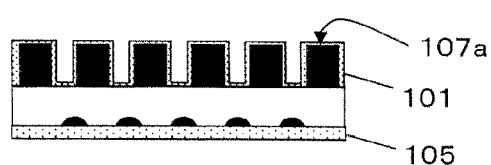

Then, as shown in FIG. 4H, the second gas-transmissive electrode 101 is formed in a continuous pattern on the main surface 107b of the support 107, the side surface of the openings 109, and the second main surface 102b of the electrolytic layer 102 that is exposed at the bottom surfaces of the openings 109. The second gas-transmissive electrode 101 may be formed by any of method for forming a porous metal film, with no specific limitation. The second gas-transmissive electrode 101 is formed as follows, for example. To the main surface 107b of the support 107, the side surfaces of the openings 109, and the second main surface 102b of the electrolytic layer 102 that is exposed at the bottom surfaces of the openings 109, a paste containing metal powder particles, specifically, nickel powder particles or silver powder particles, dispersed therein is applied. The resultant body is heated in an inert gas atmosphere, a reduction gas atmosphere or a vacuum atmosphere to remove components other than the metal powder particles from the paste. The heating is further performed up to 650 to 850° C. in the case where nickel powder particles are used, or up to 450 to 750° C. in the case where silver powder particles are used. As a result, the metal powder particles are sintered, and thus the second gas-transmissive electrode 101 of a porous metal film is formed. In this manner, the proton conductor device is produced.

EXAMPLES

The proton conductor devices in Embodiments 1 and 2 were produced, and characteristics thereof were measured. The results will be described.

Example 1

The proton conductor device 151 including the proton conductor device 106 shown in FIGS. 1A, and 1B was produced in Example 1.

The proton conductor device in Example 1 was produced as follows.

First, as shown in FIG. 2A, the catalyst particles 103 formed of platinum were formed by a sputtering vapor deposition technique on the support 104 (100 mm×100 mm; thickness: 450 μm) formed of a single-crystalline MgO substrate having a (100) plane. During the sputtering, the temperature of the substrate was set to 500° C., Ar was caused to flow at a flow rate of 2 SCCM, and the gas pressure was adjusted to 0.5 Pa. The resultant catalyst particles 103 had a thickness (height) of 100 nm.

Next, as shown in FIG. 2B, the electrolytic layer 102 was formed on the catalyst particles 103 by a sputtering vapor deposition technique by use of $BaZr_{0.8}Y_{0.2}O_3$ as a target. During the sputtering, the temperature of the substrate was set to 650° C., $O_2$ and Ar were each caused to flow at a flow rate of 1 SCCM, and the gas pressure was adjusted to 2 Pa.

The warp of the support before the film formation and the warp of the support after the film formation were measured by use of a step gauge to calculate the stress. The stress was a compressive stress and was 0.9 GPa. The electrolytic layer 102 had a thickness of 500 nm.

As shown in FIG. 2C, the mask 201 was formed on the support 104 by photolithography. Next, the resultant body was immersed in a heated phosphoric acid solution of 80° C. for 2 hours to perform etching on the support 104 formed of the MgO substrate. As a result, the openings 108 were formed.

As shown in FIG. 2D, the mask 201 was removed by being immersed in a stripping solution for a certain time duration. Next, soft glass, an organic binder and silver particles were mixed to form a slurry. Then, the slurry was applied to the electrolytic layer 102. After this, the resultant body was sintered at 700° C. for 1 hour to form the second gas-transmissive electrode 101.

As shown in FIG. 2E, a slurry obtained by mixing soft glass, an organic binder and silver particles like the slurry used to form the second gas-transmissive electrode 101 was applied to the support 104 and the catalyst particles 103 in the support 104 through the openings 108. The resultant body was sintered at 700° C. for 1 hour to form the first gas-transmissive electrode 105 in a continuous pattern. The first gas-transmissive electrode 105 and the catalyst particles 103 were put into contact with, and electrically connected to, each other.

The proton conductor device in Example 1 produced as described above was evaluated. An impedance analyzer was connected to the second gas-transmissive electrode 101 and the first gas-transmissive electrode 105, and the conductivity was found in a mixed gas (Ar: 97%+$H_2$: 3%) atmosphere. The conductivity was $2.4 \times 10^{-3}$ S/cm.

The crystalline structure of the proton conductor 106 was investigated by use of an x-ray diffractometer (X'Pert MRD produced by Philips). It was found from the x-ray diffraction pattern that a (001) orientation of the oxide of the electrolytic layer 102 is aligned in a direction vertical to the main surface of the support 104, and was single-crystalline. It was found from the pole figure that the crystal was a tetragonal crystal.

Similarly, it was found from the x-ray diffraction pattern that platinum of the catalyst particles 103 was also of a single crystal aligned in the (001) orientation.

Figure 5:
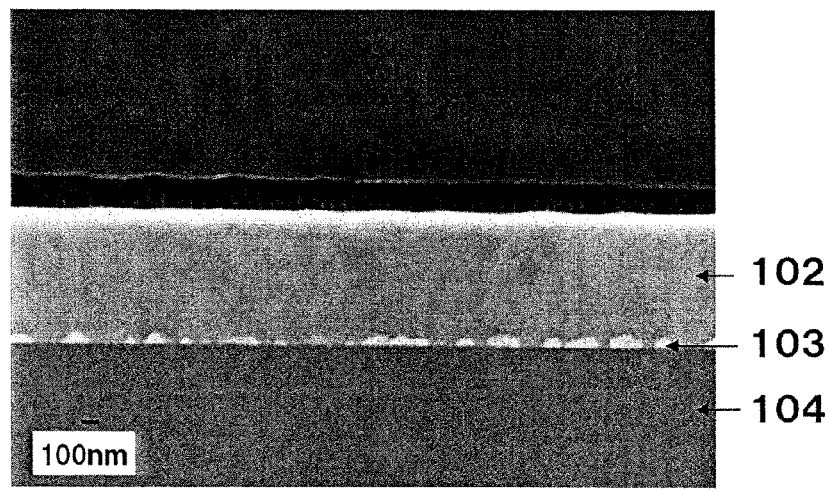
FIG. 5 shows an SEM image of a cross-section of a proton conductor device in Example 1.

Next, a cross-section of the proton conductor 106 was observed by use of a scanning electron microscope (S-4500 produced by Hitachi, Ltd.). FIG. 5 shows an SEM image of a cross-section of the proton conductor 106. It was confirmed from this result that the catalyst particles 103 were buried in the electrolytic layer 102 in an island-like arrangement. The arithmetic average roughness (Ra) of the third main surface 102e was found from the SEM image of the cross-section.

Ra is an arithmetic average roughness of an absolute value of the distance from the average line to the surface roughness profile.

The value of Ra is expressed by formula (3) below.

[Formula 1]

$$Ra = \frac{1}{L} \cdot \int_0^l |f(x)| dx \qquad (3)$$

Figure 6:
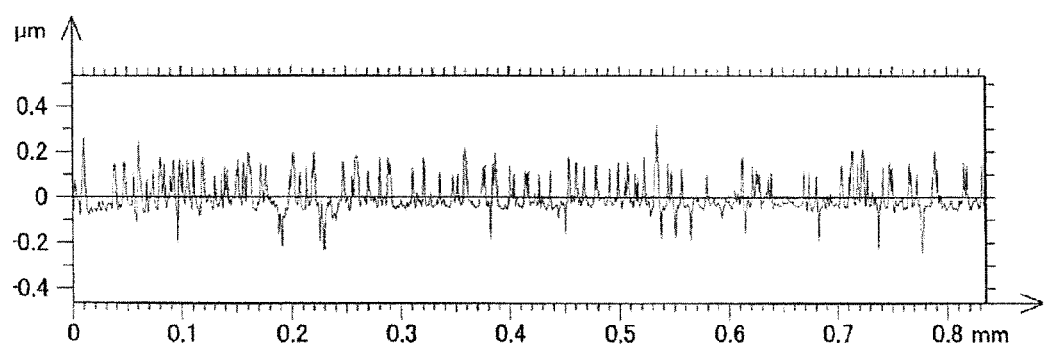
FIG. 6 is a chart showing an example of surface roughness profile.

In the formula, L represents the evaluation length, and f(x) represents the surface roughness profile. The "surface roughness profile" is a profile obtained by measuring a convexed and concaved shape of a surface of a target. FIG. 6 shows an example of surface roughness profile.

The surface roughness profile of the catalyst particles 103 was found from the SEM image of the cross-section in FIG. 5, and Ra was calculated. Ra was 1 nm.

The maximum height Rz of the catalyst particles 103 was found with the electrolytic layer 102 being considered as a bottom surface. Rz is obtained as follows. From the roughness curve, only the standard length in the direction of the average line is sampled. The distance between the peak line and the valley line of the sampled part is measured in a direction of the vertical magnification of the roughness curve. Rz was found to be 26 nm.

The electrolytic layer 102 was heated to 700° C. and then cooled down to room temperature. The surface of the electrolytic layer 102 was checked by use of a scanning electron microscope. No crack was found. The catalyst particles 103 were not observed as being stripped.

The composition of the electrolytic layer 102 was analyzed by use of an inductively coupled plasma optical emission spectrometer (ICP; SPS1700VR produced by Hitachi High-Tech Science Corporation). The amount of Ba was 0.89, the amount of Zr was 0.79, and the amount of Y was 0.21.

Example 2

In Example 2, the proton conductor device 152 including the proton conductor device 106 shown in FIGS. 3A and 3B was produced.

As shown in FIG. 4A, the catalyst particles 103 formed of platinum were formed on the support 104' formed of a single-crystalline MgO substrate in substantially the same manner as in Example 1. The resultant catalyst particles 103 had a thickness of 100 nm.

Next, as shown in FIG. 4B, the electrolytic layer 102 was formed on the catalyst particles 103 in substantially the same manner as in Example 1. The composition of the target was $BaZr_{0.65}Y_{0.35}O_3$. During the sputtering, the temperature of the substrate was set to 740° C., $O_2$ and Ar were each caused to flow at a flow rate of 1 SCCM, and the gas pressure was adjusted to 0.5 Pa. The stress of the resultant electrolytic layer 102 was a compressive stress and was 1.0 GPa. The electrolytic layer 102 had a thickness of 500 nm.

As shown in FIG. 4C, the mask 202 was formed on the electrolytic layer 102 by photolithography.

Next, as shown in FIG. 4D, the support 107 was formed by a sputtering vapor deposition technique by use of Ni as a target. During the sputtering, the temperature of the substrate was set to room temperature, Ar was caused to flow at a flow rate of 2 SCCM, and the gas pressure was adjusted to 0.5 Pa. The resultant support had a thickness 3 μm.

As shown in FIG. 4E, the mask 202 was removed by being immersed in a stripping solution for a certain time duration.

As shown in FIG. 4F, the support 104' formed of the MgO substrate was removed by being immersed in a heated phosphoric acid solution of 80° C. for 2 hours.

As shown in FIG. 4G, the first gas-transmissive electrode 105 was formed on the electrolytic layer 102 and the catalyst particles 103 in substantially the same manner as in Example 1. The first gas-transmissive electrode 105 and the catalyst particles 103 were put into contact with, and electrically connected to, each other.

As shown in FIG. 4H, the second gas-transmissive electrode 101 was formed in substantially the same manner as in Example 1.

The resultant device in Example 2 was evaluated. The conductivity was $3.7 \times 10^{-3}$ S/cm.

It was confirmed from the x-ray diffraction pattern that platinum of the catalyst particles 103 and the oxide of the electrolytic layer 102 were of a single crystal having the (001) orientation in a direction vertical to the main surface of the support 104. It was found from the pole figure that the oxide was of a tetragonal crystal.

As a result of observing an SEM image of a cross-section of the proton conductor device, it was confirmed that the catalyst particles 103 were buried in the electrolytic layer 102 and no stripping occurred. Ra was 49 nm, and Rz was 98 nm.

The electrolytic layer 102 was heated to 700° C. and then cooled down to room temperature. The surface of the electrolytic layer 102 was checked by use of a scanning electron microscope. No crack was found.

The composition of the electrolytic layer 102 was analyzed by use of an ICP. The amount of Ba was 0.75, the amount of Zr was 0.65, and the amount of Y was 0.35.

Example 3

A proton conductor device was produced in substantially the same manner as in Example 2 except for the composition of the electrolytic layer 102. An analysis performed by use of an ICP found that the amount of Ba was 0.99, the amount of Zr was 0.98 and the amount of Y was 0.02 in the electrolytic layer 102. The conductivity was $5.1 \times 10^{-4}$ S/cm. The stress of the electrolytic layer 102 was a compressive stress and was 890 MPa.

As a result of observing a cross-section of the proton conductor device, it was confirmed that the catalyst particles 103 were buried in the electrolytic layer 102 and no stripping occurred. Ra was 12 nm, and Rz was 49 nm.

Example 4

A proton conductor device was produced in substantially the same manner as in Example 2 except for the composition of the electrolytic layer 102. An analysis performed by use of an ICP found that the amount of Ba was 0.60, the amount of Zr was 0.60 and the amount of Y was 0.40 in the electrolytic layer 102. The conductivity was $4.6 \times 10^{-4}$ S/cm. The stress of the electrolytic layer 102 was a compressive stress and was 250 MPa.

As a result of observing a cross-section of the proton conductor device, it was confirmed that the catalyst particles 103 were buried in the electrolytic layer 102 and no stripping occurred. Ra was 31 nm, and Rz was 52 nm.

Example 5

A proton conductor device was produced in substantially the same manner as in Example 2 except for the composition of the electrolytic layer 102. An analysis performed by use of an ICP found that the amount of Ba was 0.30, the amount of Zr was 0.65 and the amount of Y was 0.35 in the electrolytic layer 102. The conductivity was $1.2 \times 10^{-5}$ S/cm. The stress of the electrolytic layer 102 was a compressive stress and was 450 MPa.

As a result of observing a cross-section of the proton conductor device, it was confirmed that the catalyst particles 103 were buried in the electrolytic layer 102 and no stripping occurred. Ra was 26 nm, and Rz was 35 nm.

Comparative Example 1

A device was produced in substantially the same manner as in Example 1 except that the electrolytic layer 102 was formed of a polycrystalline oxide.

The electrolytic layer was formed by a sputtering vapor deposition technique. During the sputtering, the temperature of the substrate was set to 600° C., $O_2$ and Ar were each caused to flow at a flow rate of 2 SCCM, and the gas pressure was adjusted to 1 Pa. An analysis performed by use of an ICP found that the amount of Ba was 0.74, the amount of Zr was 0.65 and the amount of Y was 0.35 in the electrolytic layer 102.

The conductivity was $1.2 \times 10^{-6}$ S/cm. The stress of the electrolytic layer 102 was a compressive stress and was 920 MPa.

As a result of observing a cross-section of the device, it was confirmed that the catalyst particles 103 were buried in the electrolytic layer 102 and no stripping occurred. Ra was 16 nm, and Rz was 32 nm.

Comparative Example 2

A device was produced in substantially the same manner as in Example 2 except that the electrolytic layer 102 was formed of a polycrystalline oxide.

The electrolytic layer was formed by a sputtering vapor deposition technique. During the sputtering, the temperature of the substrate was set to 600° C., $O_2$ and Ar were each caused to flow at a flow rate of 2 SCCM, and the gas pressure was adjusted to 1 Pa. An analysis performed by use of an ICP found that the amount of Ba was 0.73, the amount of Zr was 0.65 and the amount of Y was 0.35 in the electrolytic layer 102.

The conductivity was 9.4×10$^{-5}$ S/cm. The stress of the electrolytic layer 102 was a compressive stress and was 720 MPa.

As a result of observing a cross-section of the device, it was confirmed that the catalyst particles 103 were buried in the electrolytic layer 102 and no stripping occurred. Ra was 23 nm, and Rz was 45 nm.

Comparative Example 3

Figure 7:
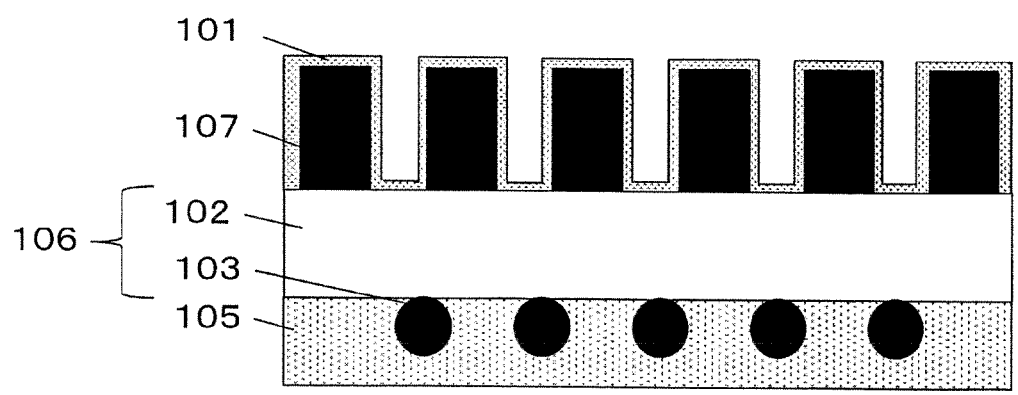
FIG. 7 is a cross-sectional view of a proton conductor device in Comparative Example 1.
Figure 8:
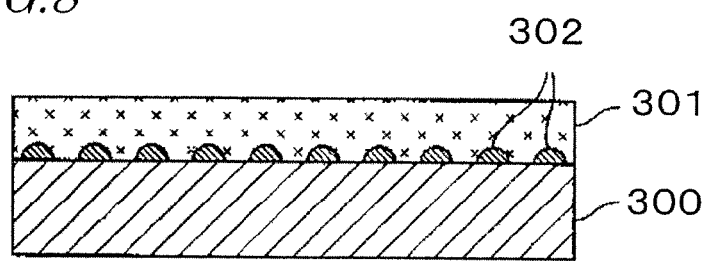
FIG. 8 is a cross-sectional view showing a conventional proton conductor.

As shown in FIG. 7, a device was produced in substantially the same manner as in Example 2 except that the catalyst particles 103 were formed on a surface of the electrolytic layer 102. An analysis performed by use of an ICP found that the amount of Ba was 0.75, the amount of Zr was 0.65 and the amount of Y was 0.35 in the electrolytic layer 102.

The conductivity was 7.6×10$^{-6}$ S/cm. The stress of the electrolytic layer 102 was a compressive stress and was 1.0 GPa.

As a result of observing a cross-section of the device, it was confirmed that the catalyst particles 103 were separately located in an island-like arrangement and no stripping occurred. Ra was 98 nm, and Rz was 378 nm.

Comparative Example 4

A device was produced in substantially the same manner as in Example 2 except that the support 104 was formed of a sapphire substrate (linear expansion coefficient: 7.7×10$^{-6}$ K$^{-1}$) and that the stress was decreased. An analysis performed by use of an ICP found that the amount of Ba was 0.75, the amount of Zr was 0.65 and the amount of Y was 0.35 in the electrolytic layer 102.

The conductivity was 7.2×10$^{-7}$ S/cm. The stress of the electrolytic layer 102 was a compressive stress and was 40 MPa.

As a result of observing a cross-section of the device, the catalyst particles 103 were recognized to be stripped. Ra was 32 nm, and Rz was 54 nm.

Comparative Example 5

A device was produced in substantially the same manner as in Example 2 except that a platinum thin film was used instead of the crystal particles 103.

An observation of a cross-section of the device found that Ra was 7 nm and Rz was 98 nm.

The device in Comparative Example 5 did not cause any electrode reaction because a three-phase interface was not formed due to the platinum thin film. Therefore, it was not possible to find the conductivity.

Comparative Example 6

A device was produced in substantially the same manner as in Example 2 except that the catalyst particles 103 were not provided. The device in Comparative Example 6 did not cause any electrode reaction because the catalyst particles 103 were not present. Therefore, it was not possible to find the conductivity.

Comparative Example 7

A device was produced in substantially the same manner as in Example 2 except that the platinum particles located in an island-like arrangement to form the catalyst particles 103 had an Ra of 52 nm and an Rz of 436 nm.

The convexed and concaved portions at the surfaces of the crystal particles 103 were large, and therefore the electrolytic layer 102 stacked on the crystal particles 103 were polycrystalline. An analysis performed by use of an ICP found that the amount of Ba was 0.65, the amount of Zr was 0.65 and the amount of Y was 0.35 in the electrolytic layer 102. The conductivity was 6.7×10$^{-6}$ S/cm. The stress of the electrolytic layer 102 was a compressive stress and was 590 MPa.

(Results and Discussion)

Table 1 summarizes these results. As can be seen from Table 1, it is considered that the proton conductor devices in Examples 1 through 5 each include an electrolytic layer of a single crystal aligned in the (001) orientation because the catalyst particles are of a single crystal aligned in the (001) orientation. The proton conductor devices in Examples 1 through 5 each have a high proton conductivity because the electrolytic layer is single-crystalline. Since the catalyst particles are buried, the contact area size between the electrolytic layer and the catalyst particles is large. In addition, the surface roughness of the main surface of the electrolytic layer in which the catalyst particles are buried is greater than or equal to 1 nm and less than or equal to 50 nm. For these reasons, gas is efficiently supplied from outside to the three-phase interface at which the electrode reaction occurs. This is also why the proton conductor devices in Examples 1 through 5 each have a high conductivity. Since the electrolytic layer has a compressive stress, neither the electrolytic layer nor the catalyst particles are stripped from the support and the structure can be maintained. Therefore, these proton conductor devices are considered to be highly reliable.

TABLE 1

| | Example 1 | Example 2 | Example 3 | Example 4 | Example 5 | Comparative example 1 | Comparative example 2 | Comparative example 3 | Comparative example 4 | Comparative example 5 | Comparative example 6 | Comparative example 7 |
|---|---|---|---|---|---|---|---|---|---|---|---|---|
| Electrolyte | Single crystalline | Single crystalline | Single crystalline | Single crystalline | Single crystalline | Polycrystalline | Polycrystalline | Single crystalline | Single crystalline | Single crystalline | Single crystalline | Polycrystalline |
| Alignment of electrolyte | (001) | (001) | (001) | (001) | (001) | — | — | (001) | (001) | (001) | (001) | — |
| Ba amount | 0.89 | 0.65 | 0.99 | 0.60 | 0.3 | 0.74 | 0.73 | 0.75 | 0.75 | 0.75 | 0.65 | 0.65 |
| Y amount | 0.21 | 0.35 | 0.02 | 0.40 | 0.35 | 0.35 | 0.35 | 0.35 | 0.35 | 0.35 | 0.35 | 0.35 |
| Com- | 0.9 | 1.0 | 890 | 250 | 450 | 920 | 720 | 1.0 | 40 | 1.0 | 820 | 590 |

TABLE 1-continued

|  | Example 1 | Example 2 | Example 3 | Example 4 | Example 5 | Comparative example 1 | Comparative example 2 | Comparative example 3 | Comparative example 4 | Comparative example 5 | Comparative example 6 | Comparative example 7 |
|---|---|---|---|---|---|---|---|---|---|---|---|---|
| pressive stress | GPa | Gpa | MPa | Mpa | Mpa | Mpa | MPa | Gpa | Mpa | GPa | Mpa | Mpa |
| Platinum particles | Single crystal-line | Single crystal-line | Single crystal-line | Single crystal-line | Single crystal-line | Single crystal-line | Single crystal-line | Single crystal-line | Single crystal-line | Single crystal-line | — | Single crystal-line |
| Alignment of platinum particles | (001) | (001) | (001) | (001) | (001) | (001) | (001) | (001) | (001) | (001) | — | (001) |
| Support | MgO | MgO | MgO | MgO | MgO | MgO | MgO | MgO | Sapphire | MgO | MgO | MgO |
| Structure * | 1 | 2 | 2 | 2 | 2 | 1 | 2 | 2 | 2 | 2 | 2 | 2 |
| State of catalyst particles | Buried | Buried | Buried | Buried | Buried | Buried | Buried | Exposed | Buried | Buried | None | Buried |
| Stripping of particles | Not stripped | Not stripped | Not stripped | Not stripped | Not stripped | Not stripped | Not stripped | Not stripped | Stripped | Not stripped | Not stripped | Not stripped |
| Ra (nm) | 1 | 49 | 12 | 31 | 26 | 16 | 23 | 98 | 32 | 7 | — | 65 |
| Rz (nm) | 26 | 98 | 49 | 52 | 35 | 32 | 45 | 378 | 54 | 98 | — | 436 |
| Conductivity (s/cm) | $2.4 \times 10^{-3}$ | $3.7 \times 10^{-3}$ | $5.1 \times 10^{-4}$ | $4.6 \times 10^{-4}$ | $1.2 \times 10^{-5}$ | $1.2 \times 10^{-6}$ | $9.4 \times 10^{-5}$ | $7.6 \times 10^{-6}$ | $7.2 \times 10^{-7}$ | — | — | $6.7 \times 10^{-6}$ |

* 1: Embodiment 1; 2: Embodiment 2

By contrast, the proton conductor devices in Comparative Examples 1, 2 and 7 do not have a good proton conductivity because the electrolytic layer is polycrystalline. The proton conductor device in Comparative Example 3 include the single-crystalline electrolytic layer, but has the catalyst particles exposed from the electrolytic layer. Therefore, the contact area size between the catalyst particles and the electrolytic layer is small, and thus the three-phase interface at which the electrode reaction may occur is small. For this reason, an area in which the electrode reaction occurs is small, and the conductivity is low. In the proton conductor device in Comparative Example 4, the catalyst particles are stripped. Therefore, the contact area size between the catalyst particles and the electrolytic layer is small, and thus the conductivity is also low.

The proton conductor device in Comparative Example 5 uses the platinum thin film instead of the catalyst particles. Therefore, gas, which is a material for the electrode reaction, is not supplied to the interface between the electrolytic layer and the platinum thin film. For this reason, the reduction reaction of proton does not occur. The proton conductor device in Comparative Example 6 does not cause the reduction reaction of proton either for the absence of the catalyst particles.

Based on these results, it is seen that the proton conductor devices in Examples 1 through 5 each have a high proton conductivity for the above-described reasons.

A proton conductor and a proton conductor device disclosed in this application have a high proton conductivity, and therefore are useful for a home-use or business-use fuel cell or for a hydrogen generation or storage device.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A proton conductor, comprising:
    an electrolytic layer having first and second main surfaces; and
    a plurality of catalyst particles;
    wherein:
    the first main surface of the electrolytic layer includes a flat portion and a plurality of recessed portions;
    the plurality of catalyst particles are respectively located in the plurality of recessed portions;
    the flat portion of the first main surface and parts of surfaces of the plurality of catalyst particles exposed from the plurality of recessed portions form a third main surface;
    the electrolytic layer is formed of a single crystal of a perovskite-type oxide having a proton conductivity;
    the plurality of catalyst particles are formed of a single crystal of a noble metal material; and
    the perovskite-type oxide of the electrolytic layer has a crystal orientation that matches a crystal orientation of the noble metal,
    wherein a stress of the electrolytic layer is a compressive stress, and is greater than or equal to 250 MPa and less than or equal to 1.0 GPa.

2. The proton conductor of claim 1, wherein the third main surface has an arithmetic average roughness (Ra) of greater than or equal to 1 nm and less than or equal to 50 nm.

3. The proton conductor of claim 1, wherein the noble metal material is single-crystalline.

4. The proton conductor of claim 1, wherein the noble metal material is platinum.

5. The proton conductor of claim 1, wherein the crystal orientation is (001).

6. The proton conductor of claim 1, wherein the perovskite-type oxide is of a tetragonal crystal system.

7. The proton conductor of claim 1, wherein:
    the perovskite-type oxide is formed of a material having a composition represented by $A_xL_{1-y}M_yO_{3-\alpha}$:

the A contains Ba, and x is greater than or equal to 0.6 and less than 1; and the M contains Y, and y is greater than 0 and less than or equal to 0.40.

8. A proton conductor device, comprising:
the proton conductor of claim 1;
a support that is provided on the third main surface of the proton conductor and has an opening;
a first gas-transmissive electrode provided in at least the opening of the support so as to be in contact with the third main surface in the opening; and
a second gas-transmissive electrode provided on the second main surface;
wherein a part of the surface of at least one of the plurality of catalyst particles is located in the opening of the support and is in contact with the first gas-transmissive electrode.

9. A proton conductor device, comprising:
the proton conductor of claim 1;
a first gas-transmissive electrode provided on the third main surface of the proton conductor;
a support that is provided on the second main surface, has an opening, and exposes the second main surface in the opening; and
a second gas-transmissive electrode provided in the opening of the support so as to be in contact with the second main surface of the electrolytic layer in at least the opening.

10. The proton conductor device of claim 8, wherein the support is formed of magnesium oxide, strontium titanate or silicon.

11. A fuel cell, comprising:
a proton conductor of claim 1;
a positive electrode in contact with the third main surface of the proton conductor; and
an negative electrode in contact with the second main surface of the proton conductor.

12. A hydrogen storage device, comprising:
a proton conductor of claim 1;
a positive electrode in contact with the third main surface of the proton conductor; and
an negative electrode in contact with the second main surface of the proton conductor.

13. A method for producing a proton conductor, comprising the steps of:
forming a plurality of catalyst particles formed of a single crystal of a noble metal material on a support; and
forming an electrolytic layer on the support such that the electrolytic layer covers the plurality of catalyst particles, the electrolytic layer being formed of a single crystal of a perovskite-type oxide having a crystal orientation matching that of the noble metal material and has a proton conductivity,
wherein a stress of the electrolytic layer is a compressive stress, and is greater than or equal to 250 MPa and less than or equal to 1.0 GPa.

14. The proton conductor of claim 2, wherein the noble metal material is single-crystalline.

* * * * *